United States Patent
Xu et al.

(10) Patent No.: US 9,728,639 B2
(45) Date of Patent: Aug. 8, 2017

(54) TUNNEL FIELD EFFECT TRANSISTORS HAVING LOW TURN-ON VOLTAGE

(71) Applicant: Samsung Electronics Co., Ltd., Suwon-si (KR)

(72) Inventors: Nuo Xu, San Jose, CA (US); Jing Wang, San Jose, CA (US); Woosung Choi, Pleasanton, CA (US)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/642,918

(22) Filed: Mar. 10, 2015

(65) Prior Publication Data

US 2016/0197184 A1 Jul. 7, 2016
US 2016/0359041 A9 Dec. 8, 2016

Related U.S. Application Data

(60) Provisional application No. 62/099,366, filed on Jan. 2, 2015, provisional application No. 62/102,829, filed on Jan. 13, 2015.

(51) Int. Cl.
*H01L 29/78* (2006.01)
*H01L 29/08* (2006.01)
(Continued)

(52) U.S. Cl.
CPC .... *H01L 29/7848* (2013.01); *H01L 21/26513* (2013.01); *H01L 21/28035* (2013.01); *H01L 29/0688* (2013.01); *H01L 29/0847* (2013.01); *H01L 29/165* (2013.01); *H01L 29/4916* (2013.01); *H01L 29/66636* (2013.01); *H01L 29/66977* (2013.01); *H01L 29/7391* (2013.01); *H01L 29/7843* (2013.01); *H01L 29/7845* (2013.01)

(58) Field of Classification Search
None
See application file for complete search history.

(56) References Cited

U.S. PATENT DOCUMENTS 7,214,629 B1 * 5/2007 Luo ................. H01L 21/823807
257/635
7,812,370 B2 10/2010 Bhuwalka et al.
(Continued)

OTHER PUBLICATIONS

Hsu-Yu Chang et al., "The SiGe Heterojunction Source PNPN n-MOSFET with SSOI for Low Power Application," SOI Conference, 2009 IEEE International, pp. 1-2, Oct. 8, 2009.
(Continued)

*Primary Examiner* — William Coleman
*Assistant Examiner* — Kien Ly
(74) *Attorney, Agent, or Firm* — Myers Bigel, P.A.

(57) ABSTRACT

Tunnel field effect transistors include a semiconductor substrate; a source region in the semiconductor substrate; a drain region in the semiconductor substrate; a channel region in the semiconductor substrate between the source region and the drain region; and a gate electrode on the semiconductor substrate above the channel region. The source region comprises a first region having a first conductivity type, a third region having a second conductivity type that is different from the first conductivity type, and a second region having an intrinsic conductivity type that is between the first region and the third region.

21 Claims, 10 Drawing Sheets

(51) Int. Cl.
  *H01L 29/66* (2006.01)
  *H01L 21/265* (2006.01)
  *H01L 29/06* (2006.01)
  *H01L 29/165* (2006.01)
  *H01L 29/739* (2006.01)
  *H01L 21/28* (2006.01)
  *H01L 29/49* (2006.01)

(56) References Cited

U.S. PATENT DOCUMENTS

| | | |
|---|---|---|
| 7,834,345 B2 | 11/2010 | Bhuwalka et al. |
| 8,318,568 B2 | 11/2012 | Doris et al. |
| 8,368,127 B2 | 2/2013 | Zhu et al. |
| 8,384,122 B1 | 2/2013 | Hu et al. |
| 8,405,121 B2 * | 3/2013 | Gossner ............... H01L 29/083 257/104 |
| 8,421,165 B2 | 4/2013 | Loh et al. |
| 8,436,422 B2 | 5/2013 | Loh et al. |
| 8,828,812 B2 * | 9/2014 | Bian ................ H01L 29/66356 257/E21.387 |
| 8,841,191 B2 | 9/2014 | Hokazono et al. |
| 2009/0294877 A1 * | 12/2009 | Tsutsui ............... H01L 29/42368 257/411 |
| 2010/0059737 A1 * | 3/2010 | Bhuwalka ......... H01L 21/26586 257/28 |
| 2011/0084319 A1 * | 4/2011 | Zhu ................ B82Y 10/00 257/288 |
| 2011/0303950 A1 * | 12/2011 | Lauer ................ H01L 29/7391 257/192 |
| 2013/0207167 A1 * | 8/2013 | Cui ................ H01L 29/78 257/288 |
| 2014/0015009 A1 * | 1/2014 | Le Royer .......... H01L 29/66477 257/192 |
| 2014/0054657 A1 * | 2/2014 | Hokazono ......... H01L 29/66356 257/288 |
| 2014/0291759 A1 * | 10/2014 | Zhao ................ H01L 29/66598 257/336 |
| 2015/0129925 A1 * | 5/2015 | Kondo ................ H01L 29/7391 257/105 |
| 2015/0228787 A1 * | 8/2015 | Goto ................ H01L 29/4966 257/288 |
| 2015/0243751 A1 * | 8/2015 | Liu ................ H01L 29/49 257/288 |
| 2015/0243769 A1 * | 8/2015 | Goto ................ H01L 29/66356 257/9 |
| 2015/0364582 A1 * | 12/2015 | Goto ................ H01L 29/66977 257/12 |

OTHER PUBLICATIONS

Sung Hwan Kim et al., "Germanium-Source Tunnel Field Effect Transistors with Recorded High $I_{ON}/I_{OFF}$," Symposium on VLSI Technology Digest of Technical Papers, pp. 178-179, 2009.

Venkatagirish Nagavarapu, et al., "The Tunnel Source (PNPN) n-MOSFET: A Novel High Performance Transistor," IEEE Transactions on Electron Devices, vol. 55, No. 4, Apr. 2008.

Ritish Jhaveri et al., "Effect of Pocket Doping and Annealing Schemes on the Source-Pocket Tunnel Field-Effect Transistor," IEEE Transactions on Electron Devices, vol. 58, No. 1, Jan. 2011.

Pratik Patel, et al., "A Low Voltage Steep Turn-Off Tunnel Transistor Design," IEEE Simulation of Semiconductor Processes and Devices, International Conference, 2009.

Sung Hwan Kim, "Germanium-Source Tunnel Field Effect Transistors for Ultra-Low Power Digital Logic," Electrical Engineering and Computer Sciences, University of California at Berkeley, Technical Report, May 10, 2012.

* cited by examiner $C_{S,PN} > C_{S,PIN}$

TUNNEL FIELD EFFECT TRANSISTORS HAVING LOW TURN-ON VOLTAGE

CROSS-REFERENCE TO RELATED APPLICATION

The present application claims priority under 35 U.S.C. §120 to U.S. Provisional Application Ser. No. 62/099,366, filed on Jan. 2, 2015, the entire content of which is incorporated herein by reference as if set forth in its entirety.

FIELD

The inventive concepts generally relate to semiconductor devices and, more particularly, to tunnel field effect transistors that exhibit improved performance.

BACKGROUND

Internet-of-Things applications are proliferating in which everyday objects are provided with network connectivity to allow these objects to send and/or receive data over the Internet. With the proliferation of these applications, a demand has arisen for semiconductor integrated circuits that have low manufacturing cost, low standby and operating power, and moderate computing performance (e.g., in terms of data storage, processing speed and connectivity).

To achieve ultra-low power semiconductor circuits for Internet-of-Things applications, new circuit designs have been considered such as, for example, tunnel field effect transistors. However, there is still a need for semiconductor transistors that exhibit, for example, ultra-low power consumption.

SUMMARY

Pursuant to embodiments of the inventive concepts, tunnel field effect transistors are provided that include a semiconductor substrate; a source region in the semiconductor substrate; a drain region in the semiconductor substrate; a channel region in the semiconductor substrate between the source region and the drain region; and a gate electrode on the semiconductor substrate above the channel region. The source region comprises a first region having a first conductivity type, a third region having a second conductivity type that is different from the first conductivity type, and a second region having an intrinsic conductivity type that is between the first region and the third region.

In some embodiments, the first region of the source region may form a first homojunction with the second region of the source region, the third region of the source region may form a second homojunction with the channel region, and the second region of the source region may form a heterojunction with the third region of the source region.

In some embodiments, the channel region may have the first conductivity type, and the drain region may have the second conductivity type, and the third region of the source region may be between the second region of the source region and the channel region.

In some embodiments, the first conductivity type may be p-type conductivity and the second conductivity type may be n-type conductivity.

In some embodiments, the semiconductor substrate may be a silicon substrate, and the first region of the source region may include germanium and the third region of the source region and the channel region may not include germanium. In some embodiments, the second region of the source region may include germanium. For example, in some embodiments, the first and second regions of the source region may be silicon-germanium regions.

In some embodiments, the second region of the source region may directly abut the first region of the source region and extend further into the semiconductor substrate from a top surface of the semiconductor substrate than does the first region of the source region. The second region of the source region may also extend underneath the first region of the source region in some embodiments.

In some embodiments, the gate electrode may be a stressed polysilicon gate electrode that is configured to impart a longitudinal stress on at least a portion of the source region.

In some embodiments, the tunnel field effect transistor may further include a stressed silicon nitride layer on the source region between the gate electrode and a source contact.

Pursuant to further embodiments of the inventive concepts, tunnel field effect transistors are provided that include a semiconductor substrate; a source region in the semiconductor substrate, the source region including a first region that is doped with first conductivity type dopants and a second undoped region; a drain region that is doped with second conductivity type dopants in the semiconductor substrate, the second conductivity type being opposite the first conductivity type; a channel region in the semiconductor substrate between the source region and the drain region, the channel region having the first conductivity type; a gate electrode on the semiconductor substrate above the channel region; wherein the second undoped region is between the first region of the source region and the channel region.

In some embodiments, the first region of the source region may be a $Si_{1-x}Ge_{x, x>0}$ region and the channel region may be a silicon region.

In some embodiments, the second region of the source region may be a $Si_{1-x}Ge_{x, x>0}$ region.

In some embodiments, the source region may further include a third region that is doped with second conductivity type dopants that is between the second region of the source region and the channel region.

In some embodiments, the first region of the source region and the second undoped region of the source region may be $Si_{1-x}Ge_{x, x>0}$ regions, the third region of the source region and the channel region may be silicon regions, and the first conductivity type dopants may be p-type conductivity dopants and the second conductivity type dopants may be n-type conductivity dopants.

In some embodiments, a depth of the first region of the source region from a top surface of the semiconductor substrate may exceed a depth of the third region of the source region from the top surface of the semiconductor substrate.

In some embodiments, the second undoped region of the source region may directly contact the first region of the source region and may completely cover a sidewall of the first region of the source region.

In some embodiments, the second region of the source region may also extend underneath the first region of the source region.

In some embodiments, the gate electrode may be a stressed polysilicon gate electrode that is configured to impart a longitudinal stress on at least a portion of the source region.

In some embodiments, the tunnel field effect transistor may further include a stressed silicon nitride layer on the source region that is between the gate electrode and a source contact.

Pursuant to yet further embodiments of the inventive concepts, tunnel field effect transistors are provided that include a semiconductor substrate; an Si channel region in the semiconductor substrate; a source region adjacent a first side of the Si channel region that includes a first $Si_{1-x}Ge_x$, $_{x>0}$ region having a first conductivity type and a second $Si_{1-x}Ge_x$, $_{x>0}$ region having an intrinsic conductivity type that is between the first $Si_{1-x}Ge_x$, $_{x>0}$ region and the Si channel region; a drain region adjacent a second side of the Si channel region that is opposite the first side; and a gate electrode above the Si channel region.

In some embodiments, the source region may further include a third Si region that is between the second $Si_{1-x}Ge_x$, $_{x>0}$ region and the Si channel region.

In some embodiments, the Si channel region may have the first conductivity type, and the drain region may have the second conductivity type.

In some embodiments, the second $Si_{1-x}Ge_x$, $_{x>0}$ region of the source region may completely cover a sidewall of the first $Si_{1-x}Ge_x$, $_{x>0}$ region of the source region and may also extend underneath the first $Si_{1-x}Ge_x$, $_{x>0}$ region of the source region.

In some embodiments, the gate electrode may be a stressed polysilicon gate electrode that is configured to impart a longitudinal stress on at least a portion of the source region.

In some embodiments, the tunnel field effect transistor may further include a stressed silicon nitride layer on the source region between the gate electrode and a source contact.

Pursuant to still further embodiments of the inventive concepts, tunnel field effect transistors are provided that include a semiconductor substrate; a source region in the semiconductor substrate, the source region including a first region having a first conductivity type and a second region having a second conductivity type that is different from the first conductivity type, where the first region and the second region comprise different materials; a drain region having the second conductivity type in the semiconductor substrate; a channel region having the first conductivity type in the semiconductor substrate between the source region and the drain region, where the second region of the source region is between the first region of the source region and the channel region; a gate electrode on the semiconductor substrate above the channel region; and a stressed silicon nitride layer on the source region between the gate electrode and a source contact.

In some embodiments, the gate electrode may be a polysilicon layer that is stressed in the <110> direction In some embodiments, the first region of the source region may be a p-type $Si_{1-x}Ge_x$, $_{x>0}$ region and the second region of the source region may be an n-type Si region.

In some embodiments, the source region may further include a third region that is between the first region of the source region and the second region of the source region that is not doped with dopants. In some embodiments, the third region of the source region may be an undoped $Si_{1-x}Ge_x$, $_{x>0}$ region.

DETAILED DESCRIPTION

Figure 1:
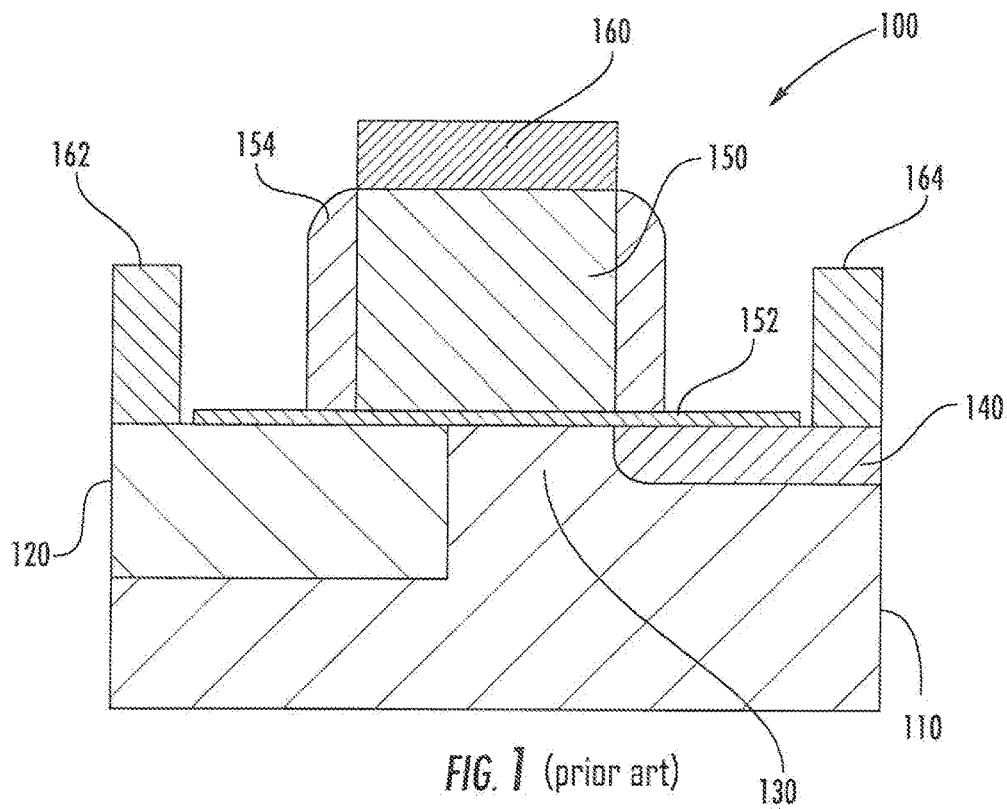
FIG. 1 is a cross-sectional diagram of a conventional tunnel field effect transistor.

Pursuant to embodiments of the inventive concepts, tunnel field effect transistors are provided that may have very low turn-on voltages and that exhibit high $I_{ON}/I_{OFF}$ ratios at very low power supply voltages. These tunnel field effect transistors may be compatible with conventional CMOS semiconductor fabrication technologies. The tunnel field effect transistors according to embodiments of the inventive concepts may be useful in a wide variety of applications, including many Internet-of-Things applications.

In some embodiments, these tunnel field effect transistors may have a p-i-n-p-n structure, a silicon-germanium source region that includes a shallow n-type pocket, and/or stressed upper layers that impart tensile strain on the source and channel regions of the device. The tunnel field effect transistors according to embodiments of the inventive concepts may have threshold voltages as low as 0 volts, and may exhibit steep sub-threshold swings as compared to conventional MOSFET and tunnel field effect transistors.

In some embodiments, the tunnel field effect transistors may include a source region that has a p-type region, an intrinsic or i-type region, and an n-type region. The i-type region may be between the p-type region and the n-type region so that the source region has a p-i-n structure. The n-type region may be a heavily-doped shallow n-type extension or "pocket" that is between the i-type region and the channel region of the device. In some embodiments, the i-type region of the source region may also extend underneath the p-type region of the source region. The channel region may be a p-type region and the drain region may be an n-type region so that the device has a p-i-n-p-n structure.

The source region of these tunnel field effect transistors may be formed at least partly of a different material than the channel region. For example, in some embodiments, the source region may include one or more silicon-germanium regions while the channel region may be formed of silicon. In some embodiments, the p-type and the i-type regions of the source region may be silicon-germanium or germanium regions, while the shallow n-type region of the source region may be a silicon region. Accordingly, the source region may include a heterojunction.

In some embodiments such as, for example, embodiments that include silicon-germanium or pure germanium in the source region, longitudinal tensile stress (i.e., stress along the <110> crystallographic plane) may be applied along the whole transistor structure. This tensile stress may reduce the bandgap of the germanium in the source region, while having very little impact on the bandgap of the silicon in the channel region. This may facilitate reducing the threshold voltage of the transistor while maintaining a low OFF-state current.

The sub-threshold slope of a metal-oxide-semiconductor field effect transistor (MOSFET) is a feature of the devices' current-voltage characteristic, which describes the relationship between the drain current and the gate voltage for gate voltages below the threshold voltage. The sub-threshold swing (SS) of a transistor is defined as the gate voltage needed to change transistor's drain current on a log scale, as shown in Equation (1):

$$SS \equiv \Delta V_{gs} / \Delta \log_{10}(I_{ds}) \quad (1)$$

For a MOSFET device, SS can be calculated as:

$$SS \equiv \ln(10)(kT/q)(1 + C_d/C_{ox}) \quad (2)$$

where kT/q is the thermal energy divided by the elementary charge, $C_d$ is the depletion layer capacitance, and $C_{ox}$ is the gate-oxide capacitance.

The sub-threshold swing is specified in units of millivolts of gate voltage per decade, where a "decade" refers to an increase in the drain current by a factor of ten (10). Generally speaking, smaller sub-threshold values may be desirable as they indicate a smaller increase in gate voltage is required to obtain a given amount of increase in the drain current of the device. For a conventional MOSFET, the minimum sub-threshold swing can be calculated as about 60 mV/decade at room temperature (300 K) by letting $C_{ox}$ approach infinity. This lower limit on the sub-threshold swing results from the nature of the thermal injection of carriers from the source into the channel.

One possible way of providing ultra-low power logic circuits is to use near-threshold computing (NTC) or sub-threshold computing (STC) circuit design paradigms. NTC refers to logic circuits that are designed to operate at or very near to the threshold voltage of the transistors included in the logic circuits. NTC computing may allow for significant reduction in the power supply voltage required for a logic circuit, and hence may exhibit significantly lower power consumption levels. STC similarly refers to logic circuits that are designed to operate at voltage levels that are below the threshold voltage of the transistors included in the logic circuits.

Tunnel field effect transistors are a relatively new type of MOSFET that have been proposed for low energy electronic applications. Tunnel field effect transistors switch between the on-state and off-state by a quantum tunneling mechanism referred to as band-to-band tunneling as opposed to through thermal injection as in a conventional MOSFET. As such, tunnel field effect transistors are not constrained to sub-threshold swings of 60 mV/decade or more at room temperature as is the case with conventional MOSFETs. Accordingly, tunnel field effect transistors have the potential to achieve higher drain current values for small gate voltages as the drain current may increase at rates of less than 60 mV/decade.

FIG. 1 is a cross-sectional diagram of a conventional tunnel field effect transistor 100.

As shown in FIG. 1, the conventional tunnel field effect transistor 100 includes a source region 120, a channel region 13Q and a drain region 140 in a substrate 110. A gate electrode 150 is on the channel region 130, and a gate insulating layer 152 is provided between the gate electrode 150 and the channel region 130. Gate spacers 154 are provided on sidewalls of the gate electrode 150, and a gate contact 160 is formed on the gate electrode 150. Source and drain contacts 162, 164 are provided on the respective source and drain regions 120, 140.

The substrate 110 may be an intrinsic (i-type) silicon substrate. The source region 120 may be a p-type silicon source region. The source region 120 extends part of the way underneath the gate electrode 150. The channel region 130 is under the gate electrode 150 between the source region 12Q and the drain region 140. The channel region 130 may comprise an upper portion of the i-type silicon substrate 110. The drain region 140 is an n-type silicon drain region. The gate electrode 150 may be a polysilicon gate electrode. The gate insulating layer 152 may be any appropriate insulating layer such as, for example, a silicon oxide layer. The gate spacers 154 may be silicon nitride spacers. The contacts 160, 162, 164 may be ohmic metal contacts and/or silicide contacts.

The tunnel field effect transistor 100 may operate as follows. A voltage may be applied to the gate contact 160 so that electron accumulation occurs. When a sufficient bias voltage is applied to the gate contact 160, the conduction band of the intrinsic channel region 130 may align with the valence band of the p-type source region 120. When this occurs, electrons from the valence band of the p-type source region 120 may tunnel into the conduction band of the intrinsic channel region 130 via a band-to-band tunneling mechanism, thereby allowing electrons to flow from the source region 120 to the drain region 140.

While, as noted above, the source region 120 may be a silicon source region 120, in other embodiments, a silicon-germanium source region 120 may be used instead. The use of a silicon-germanium source region 120 may reduce the bandgap so that band-to-band tunneling will occur at lower gate bias voltages, and hence may enhance the on-state drive current of the transistor 100.

Since tunnel field effect transistors (also referred to herein as "TFETs") operate using a band-to-band tunneling mechanism to control switching between the ON and OFF states of the transistor instead of a thermal injection mechanism, tunnel field effect transistors may theoretically achieve sub-threshold swings of less than 60 mV/decade at room temperature (300 K). Unfortunately, the tunnel field effect transistor of FIG. 1 may exhibit a low $I_{ON}/I_{OFF}$ ratio, especially at low power supply voltages $V_{DD}$, which may result from the relatively high turn-on voltage $V_T$ of the device and a non-ideal sub-threshold swing. This is also true in devices where the silicon source region 120 is replaced with a silicon-germanium source region 120.

Figure 2:
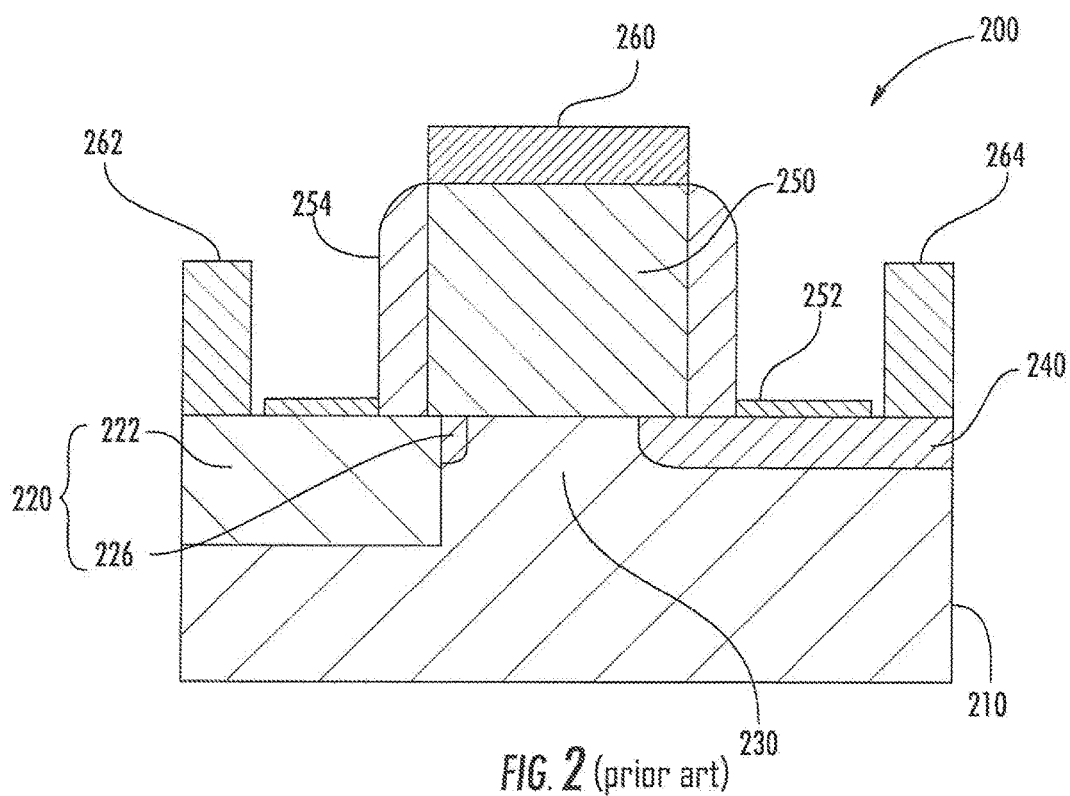
FIG. 2 is a cross-sectional diagram of a conventional p-n-p-n tunnel field effect transistor.

FIG. 2 is a cross-sectional diagram of another conventional tunnel field effect transistor 200 that has a p-n-p-n structure.

As shown in FIG. 2, the tunnel field effect transistor 200 includes a source region 220, a channel region 230 and a drain region 240 in a substrate 210. A gate electrode 250 is on the channel region 23Q, and a gate insulating layer 252 is provided between the gate electrode 250 and the channel region 230. Gate spacers 254 are provided on sidewalls of the gate electrode 250, and a gate contact 260 is formed on the gate electrode 250. Source and drain contacts 262, 264 are provided on the respective source and drain regions 220, 240.

The substrate 21Q is a p-type silicon substrate. The source region 220 includes a heavily-doped p-type silicon-germanium region 222. The source region 220 also includes a heavily-doped n-type extension 226 that is underneath the gate electrode 250. The n-type extension 226 may be a heavily-doped region in the silicon substrate 210. The channel region 230 is under the gate electrode 250 between the n-type extension 226 of the source region 220 and the drain region 240. The channel region 230 may comprise an upper portion of the p-type silicon substrate 210. The drain region 240 is an n-type silicon drain region. The gate electrode 250 may be a polysilicon gate electrode. The gate insulating layer 252 may be any appropriate insulating layer such as, for example, a silicon oxide layer. The gate spacers 254 may be silicon nitride spacers. The contacts 260, 262, 264 may be ohmic metal contacts and/or silicide contacts.

The p-n-p-n tunnel field effect transistor 200 of FIG. 2 may introduce increased band bending at a low gate voltage as compared to the tunnel field effect transistor 100 of FIG. 1, and hence may exhibit a smaller turn-on voltage $V_T$ as compared to the tunnel field effect transistor 100 of FIG. 1. The n-type source extension 226 can facilitate providing improved off-state performance while reducing the turn-on voltage $V_T$ so that the tunnel field effect transistor 200 may provide a higher drive current under low power supply voltage operation than the tunnel field effect transistor 100. However, the turn-on voltage and sub-threshold swing of the tunnel field effect transistor 200 may still be insufficient for various low power applications.

Figure 3:
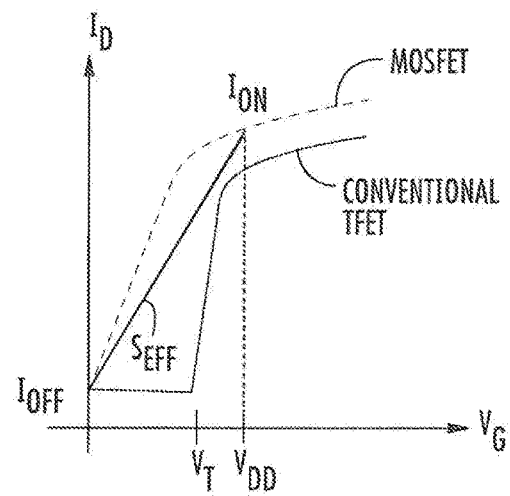
FIG. 3 is a schematic graph that illustrates the current-voltage characteristics of a conventional metal-oxide-semiconductor field effect transistor as compared to a conventional tunnel field effect transistor.

FIG. 3 is a schematic graph that illustrates the current-voltage characteristics of a conventional MOSFET as compared to a conventional tunnel field effect transistor such as the tunnel field effect transistor of FIG. 1 or FIG. 2.

As shown in FIG. 3, in a conventional MOSFET, the drain current ($I_D$) quickly starts increasing as a gate bias voltage ($V_G$) is applied. In contrast, in the conventional tunnel field effect transistor, the drain current does not start to flow until the turn-on voltage $V_T$ is reached, which occurs at a greater gate voltage than with the MOSFET. This higher turn-on voltage in the tunnel field effect transistor results from the relatively large bandgap of the silicon or silicon-germanium source region and the finite doping gradient at the source-channel junction. Thus, even though the tunnel field effect transistor may exhibit a steeper current-voltage swing than the conventional MOSFET, the larger turn-on voltage value for the tunnel field effect transistor results in a lower on-state current as compared to the MOSFET.

In order for the advantages of the tunnel field effect transistor in terms of a steeper current-voltage swing to be realized, it is desirable to reduce the turn-on voltage of the tunnel field effect transistor. Tunnel field effect transistors having such a reduced turn-on voltage are disclosed herein.

Equation (3) below defines the effective sub-threshold swing of a transistor ($S_{EFF}$), which is defined as the gate voltage, normalized by decade, that is needed to switch a transistor from $I_{OFF}$ to $I_{ON}$:

$$S_{EFF} = V_{DD}/\log_{10}(I_{ON}/I_{OFF}) \quad (3)$$

Figure 4:
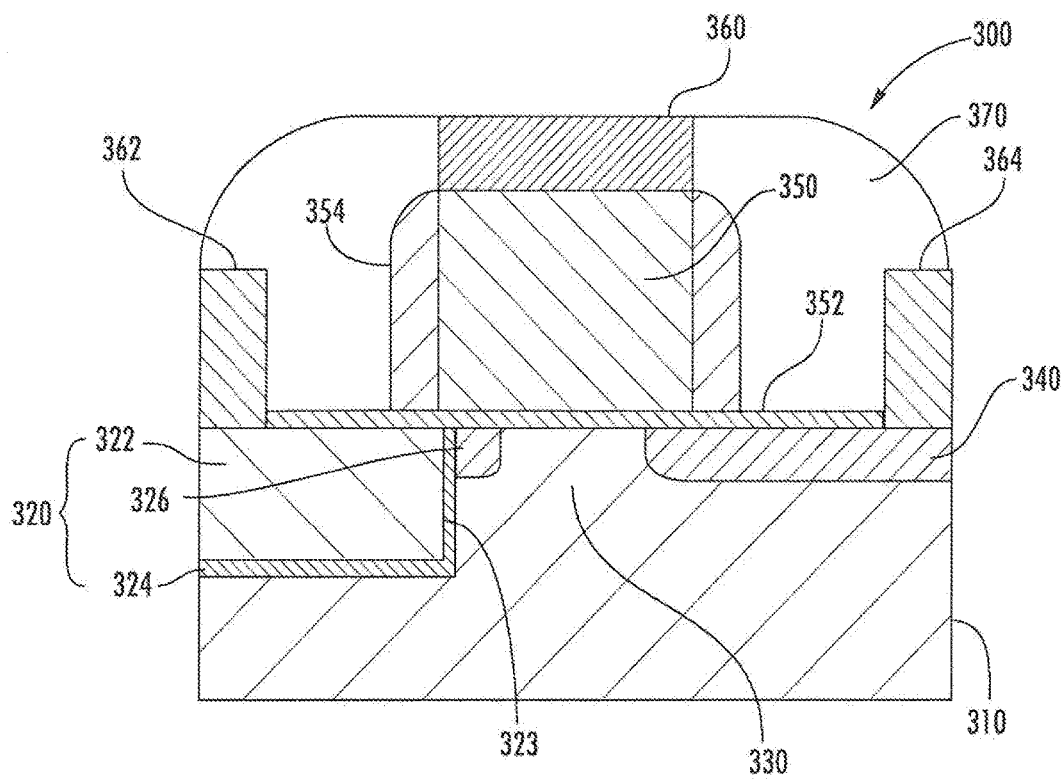
FIG. 4 is a cross-sectional diagram of a tunnel field effect transistor according to certain embodiments of the inventive concepts.

FIG. 4 is a cross-sectional diagram of a tunnel field effect transistor 300 according to certain embodiments of the inventive concepts.

Referring to FIG. 4, the tunnel field effect transistor 300 includes a source region 320, a channel region 330 and a drain region 340 in a substrate 310. A gate electrode 350 is on the channel region 330, and a gate insulating layer 352 is provided between the gate electrode 350 and the channel region 330. Gate spacers 354 are provided on sidewalls of the gate electrode 350, and a gate contact 360 is formed on the gate electrode 350. Source and drain contacts 362, 364 are provided on the respective source and drain regions 320, 340. A stressed contact liner 370 is provided on the source region 320, the drain region 340 and the gate spacers 354.

The substrate 310 may be a p-type silicon substrate. For example, the substrate 310 may be a bulk silicon substrate such as a silicon wafer that is heavily doped with p-type dopants during growth or by ion implantation. Alternatively, the substrate 310 may be a silicon-on-insulator substrate that is heavily doped with p-type dopants. In still other embodiments, the substrate 310 may comprise an epitaxially grown silicon layer on an underlying substrate.

The source region 320 includes a p-type region 322, an intrinsic (i-type) region 324, and an n-type extension 326. The p-type region 322 may be a heavily-doped region. In some embodiments, the p-type region 322 may be a silicon-germanium region that is epitaxially grown using an underlying layer as a seed. In some embodiments where the p-type region 322 is a silicon-germanium region, the germanium concentration may be between 0.25 and 0.55 by atomic weight. In other embodiments, higher germanium concentrations such as, for example, germanium concentrations greater than 0.55, or even greater than 0.8 by atomic weight may be used. In alternative embodiments, the p-type region 322 may be a pure germanium region, a germanium-tin (Sb) region, a silicon-germanium-tin region and/or a pure tin region. The p-type region 322 may be relaxed or stressed from the Si substrate 310. The p-type region 322 of the source region 320 may extend farther below a top surface of the substrate 310 than the drain region 340 and/or the n-type extension 326 of the source region 320. Herein, a pure silicon region may be referred to as an "Si region,", a silicon-germanium region may be referred to as a "$Si_{1-x}Ge_x$ region," and a region that is either silicon-germanium or pure germanium may be referred to as a "$Si_{1-x}Ge_{x,\ x>0}$ region."

The i-type region 324 of the source region 320 may comprise a $Si_{1-x}Ge_{x,\ x>0}$ region that is epitaxially grown using the Si substrate 310 as a seed layer. The i-type region 324 may be a relatively thin region. As shown in FIG. 4, in some embodiments, the i-type region 324 may be on a sidewall 323 of the p-type region 322 that faces the channel region 330 and underneath a lower surface of the p-type region 322. In other embodiments, the i-type region 324 may only be on the sidewall 323 of the p-type region 322 that faces the channel region 330. In such embodiments, the, i-type region 324 may extend along the entirety of the sidewall 323 of the p-type region 322 or may only extend along a portion of the sidewall 323 (e.g., the portion of the sidewall 323 that is adjacent the n-type extension 326).

The i-type region 324 may be an undoped region, or may be a region that is only slightly doped (either n-type or p-type). For example, as will be discussed in greater detail herein, according to one manufacturing method for the tunnel field effect transistor 300, the i-type region 324 may be epitaxially grown as an undoped $Si_{1-x}Ge_{x,\ x>0}$ layer, and then a p-type $Si_{1-x}Ge_{x,\ x>0}$ region 322 may be formed by epitaxial growth and may be doped with the p-type dopants either by doping during growth or via ion implantation. A relatively small quantity of p-type dopants may either diffuse from the p-type region 322 into the i-type region 324 or may be implanted in the i-type region 324 during the ion implantation process. As a result, the i-type region 324 may include a small number of p-type dopants. For purposes of this disclosure, the region 324 is considered to be an i-type region if the concentration of dopants in the region 324 is at least two orders of magnitude less than the concentration of dopants in the p-type region 322. For example, in some embodiments, the i-type region 324 may have a concentration of dopants of $1\times10^{17}/cm^3$ or less, while the p-type region 322 may have a concentration of dopants of at least $1\times10^{19}/cm^3$. The i-type region 324 of the source region 320 may be formed, for example, by epitaxially growing a semiconductor layer that is not doped with impurities during growth or by any later ion implantation step using the substrate 310 as a seed layer.

The n-type extension 326 may comprise a portion of the silicon substrate 310 that is heavily-doped with n-type dopants. The n-type extension 326 may be located underneath the gate electrode 350. The n-type extension 326 may be shallower than the p-type region 322 (i.e., it does not extend as far below the top surface of the substrate 310).

The channel region 330 is under the gate electrode 350 between the n-type extension 326 of the source region 320 and the drain region 340. The channel region 330 may comprise an upper portion of the p-type silicon substrate 310. The drain region 340 is an n-type silicon drain region. The drain region 340 may be shallower than the source region 320. The drain region 340 may extend part of the way underneath the gate electrode 350. In some embodiments, the drain region 340 may have a relatively uniform doping concentration along a direction parallel to a bottom surface of the substrate 31Q.

The gate electrode 350 may be a polysilicon gate electrode. In some embodiments, the gate electrode 350 may be a strained polysilicon gate electrode. The polysilicon gate electrode 350 may be strained by implanting arsenic atoms into the polysilicon using a high energy ion implantation technique, and then annealing the resultant structure. For example, arsenic atoms may be implanted into the polysilicon gate electrode 350 at an implant energy of 10-100 keV, and then the structure may be annealed at 1000-1100° C. for about 1-10,000 milliseconds.

The gate insulating layer 352 may be any appropriate insulating layer such as, for example, a silicon-oxynitride (SiON) layer. In other embodiments, the gate insulating layer may be a high dielectric constant material such as, for example, hafnium oxide. The gate spacers 354 may be silicon nitride spacers. The contacts 360, 362, 364 may be ohmic metal contacts and/or silicide contacts. The metal gate contact 360 may impart stress on the polysilicon gate electrode 350 that further strains the underlying channel region 330 and source region 320. The stressed contact liner 370 may comprise an amorphous silicon nitride layer. The stressed liner 370 is formed by a low-temperature deposition process, which is typical and used multiple times during the integrated circuit fabrication process. The contact liner 370 may be a contact etch stop liner.

Figure 5A:
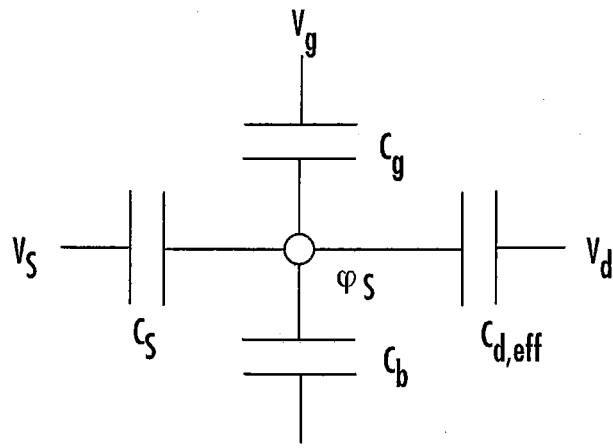
FIGS. 5A-5C are a circuit diagram and cross-sectional diagrams illustrating electrostatic modeling of a p-n source tunnel field effect transistor and a p-i-n source tunnel field effect transistor according to certain embodiments of the inventive concepts.
Figure 5B:
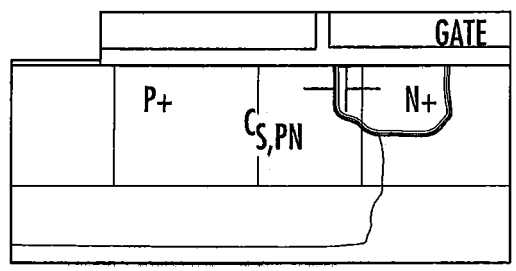
Figure 5C:
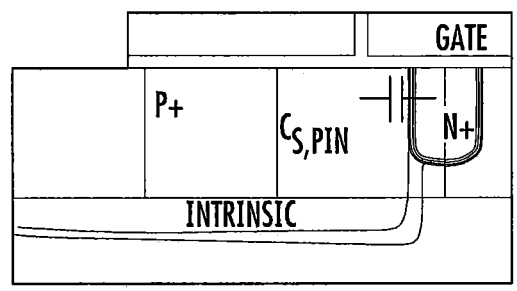

FIGS. 5A-5C are a circuit diagram and cross-sectional diagrams illustrating electrostatic modeling of a p-n source tunnel field effect transistor and a p-i-n source tunnel field effect transistor based on a two-dimensional capacitor network. As shown in FIG. 5A, the tunnel field effect transistors may be modeled as a two-dimensional capacitor network. Electrostatic modeling of the tunnel field effect transistor 200 of FIG. 2 (shown in FIG. 5B) and the tunnel field effect transistor 300 of FIG. 3 (shown in FIG. 5C) shows that the tunnel field effect transistor 300 has reduced source-channel coupling capacitance ($C_S$). The sub-threshold swing at turn-on ($SS_{turn-on}$) may be approximated as:

$$SS_{turn-on} \alpha dV_g/d\phi_s = 1+(C_s+C_b+C_{d,\ eff})/C_g \quad (4)$$

By reducing the source-channel coupling capacitance, the tunnel field effect transistor 300 may therefore exhibit reduced (i.e., improved) sub-threshold swing values.

Figure 6:
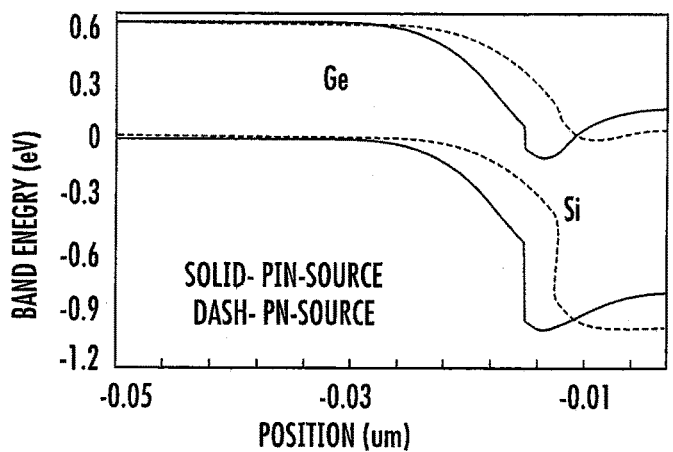
FIG. 6 is a graph of energy band diagrams of both a p-n source tunnel field effect transistor and of a p-i-n source tunnel field effect transistor according to certain embodiments of the inventive concepts.

FIG. 6 is a graph illustrating simulated energy band diagrams for the source-channel region of the tunnel field effect transistor 200 of FIG. 2 (the dashed lines in FIG. 6) and for the source-channel region of the tunnel field effect transistor 300 of FIG. 4 (the solid lines in FIG. 6). In FIG. 6, the upper lines show the band energy of the valence band and the lower lines show the band energy of the conduction band. The horizontal axis represents the distance from the side of the source region that is opposite the channel region. In the simulation used to generate the data shown in FIG. 6, it was assumed that the source region of each device (excluding the n-type extension) was a pure germanium source region.

As shown in FIG. 6, in the germanium portion of the source region of each tunnel field effect transistor, the separation between the conduction band and the valence band is relatively constant. However, at the interface between the source and the channel, the p-i-n source structure of the tunnel field effect transistor 300 of FIG. 4 exhibits greater band-bending than the p-n source structure of the tunnel field effect transistor 200 of FIG. 2, and hence the energy difference between the source conduction and channel valence bands is reduced more in the tunnel field effect transistor 300. As a result of this band-bending, a smaller gate bias voltage is needed to initiate tunneling of electrons from the valence band of the source region 320 into the conduction band of the channel region 330. Thus, FIG. 6 illustrates why the tunnel field effect transistor 300 of FIG. 4 may exhibit a lower turn-on voltage than the tunnel field effect transistor 200 of FIG. 2.

As noted above, various stressed layers may be included in the tunnel field effect transistor 300 of FIG. 4. These stressed layers include the polysilicon gate electrode 300 and the contact etch stop liner layer 37Q. Additionally, the metal gate contact 360 may impart additional stress on the polysilicon gate electrode 350 that passes to the channel region 330 and the source region 320.

Figure 7:
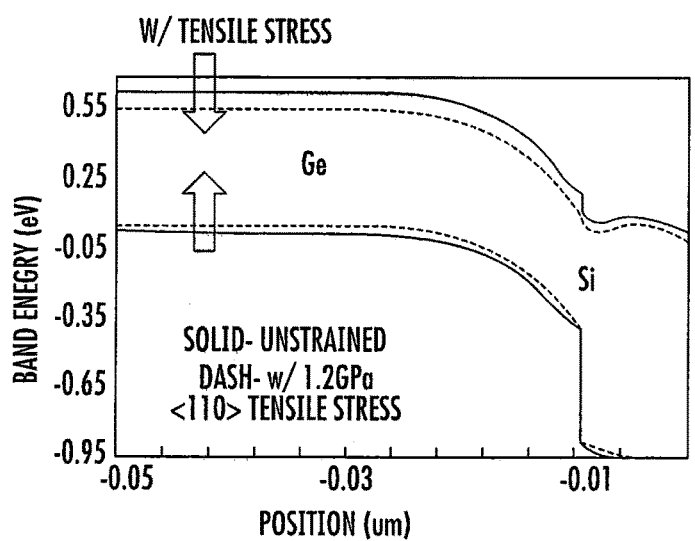
FIG. 7 is a graph of energy band diagrams illustrating how longitudinal stress may be used to reduce the bandgap energy of the source of a tunnel field effect transistor according to certain embodiments of the inventive concepts while leaving the bandgap energy of the channel region almost unchanged.

The application of longitudinal tensile <110> stress on the source region 320 may reduce the bandgap of the source region 320. This can be seen in FIG. 7, which shows the impact of the longitudinal stress on the simulated energy band diagrams for the source-channel region of the tunnel field effect transistor 300 of FIG. 3. As shown in FIG. 7, when longitudinal stress is applied, the bandgap in the p-type region 322 of the source region 320 (which in the simulation was assumed to be a pure germanium region) is reduced, which may lower the turn-on voltage for the device. While this stress may also lower the bandgap to an extent in the silicon channel region, the narrowing is significantly less pronounced in the silicon channel region, and hence should not have a major impact on the off-state current for the device. Thus, FIG. 7 suggests a way of further lowering the turn-on voltage of the tunnel field effect transistor without significantly impacting other performance characteristics of the device.

Figure 8:
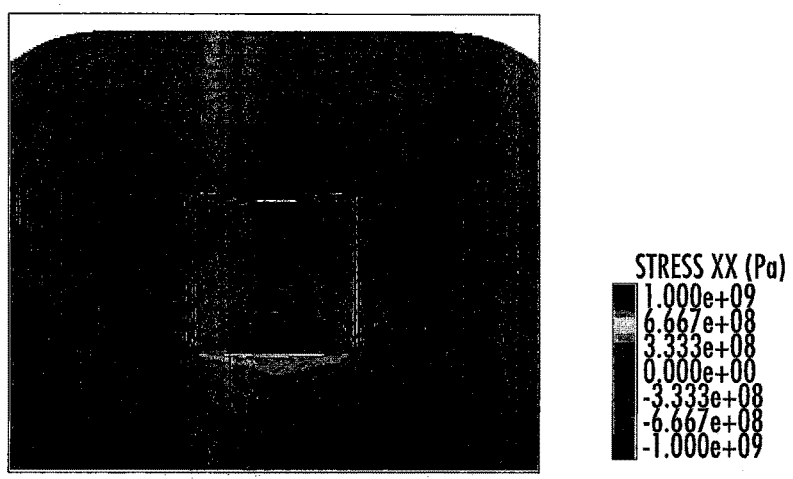
FIG. 8 is a plot of simulation results illustrating the longitudinal stress contours across a tunnel field effect transistor according to certain embodiments of the inventive concepts that result from adding tensile stress in the gate and contact liner regions of the device.

FIG. 8 is a plot of simulation results illustrating the longitudinal stress contours across a tunnel field effect transistor according to embodiments of the inventive concepts that result from adding tensile stress in the gate and contact liner regions of the tunnel field effect transistor 300 of FIG. 4. As shown in FIG. 8, the tensile stress that is generated in the gate electrode and contact liner may generate large <110> tensile strain in the source region 320 and channel region 330.

Figure 9:
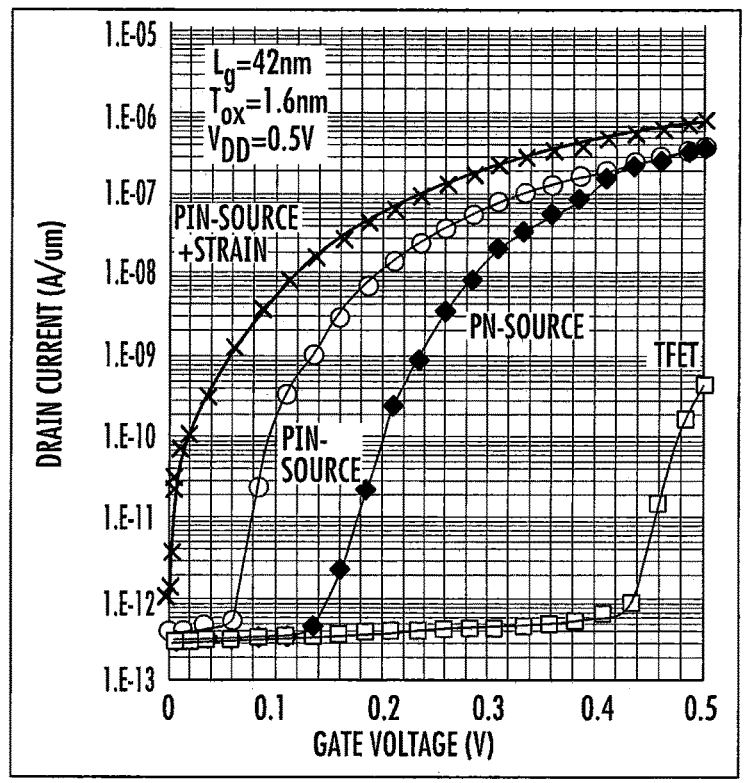
FIG. 9 is a graph of drain current versus gate voltage for various transistor designs including a tunnel field effect transistor according to certain embodiments of the inventive concepts.

FIG. 9 is a graph of the simulated drain current ($I_D$) versus gate voltage ($V_G$) for various 45 nm bulk CMOS transistor designs. As shown in the graph FIG. 9, a tunnel field effect transistor having a p-type source region such as the tunnel field effect transistor 100 of FIG. 1 may exhibit a high turn-on voltage (e.g., greater than 0.4 volts). By adding a heavily-doped n-type extension to the source region and forming the p-type portion of the source region using silicon-germanium as in the tunnel field effect transistor 200 of FIG. 2, the turn-on voltage may be reduced to about 0.14 volts. By further adding the i-type region 324 to the source region 320 as in the tunnel field effect transistor 300 of FIG. 4, the simulation of FIG. 9 indicates that the turn-on voltage may be reduced further, and the drive current may also be enhanced. By further adding <110> longitudinal tensile strain to the source region and the channel region (as is also done in the tunnel field effect transistor 300 of FIG. 4), the turn-on voltage may be reduced to about 0 volts and the effective sub-threshold swing and the on-state current may each be further improved.

Figure 10:
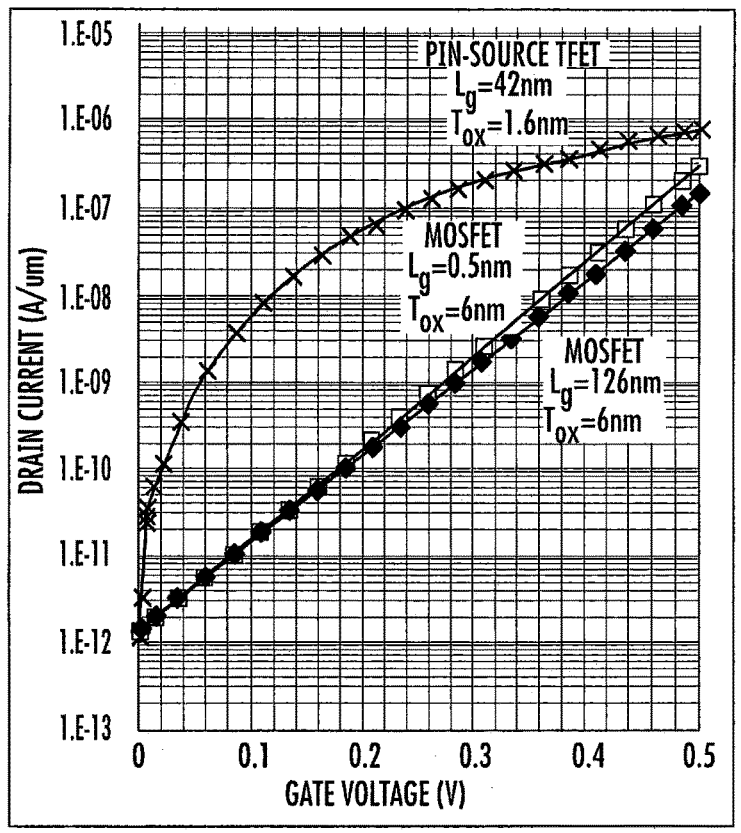
FIG. 10 is a graph of drain current versus gate voltage for additional transistor designs including a tunnel field effect transistor according to certain embodiments of the inventive concepts.

FIG. 10 is a graph of drain current versus gate voltage that compares the simulated performance for the tunnel field effect transistor 300 of FIG. 4 to two different conventional MOSFET designs. The tunnel field effect transistor 300 was modeled as having a gate length of 42 nanometers and a gate insulating thickness of 1.6 nanometers. In the first conventional MOSFET design, the MOSFET was modeled as having a gate length of 126 nanometers and a gate insulating thickness of 6 nanometers. In the second conventional MOSFET design, the MOSFET was modeled as having a gate length of 500 nanometers and a gate insulating thickness of 6 nanometers. All three devices were designed to have the same $I_{OFF}$ (i.e., $I_d$ at $V_g=0$ V). The thicker gate oxide layers and longer gate lengths were necessary in the MOSFET designs in order to increase the threshold voltage and to reduce the $I_{OFF}$. The graph of FIG. 10 shows that the tunnel field effect transistor 300 has a higher on-state current and sub-threshold swing as compared to the two MOSFET designs, suggesting that the tunnel field effect transistor 300 has the potential for extremely low-power logic circuit applications.

FIGS. 11A-11D are graphs illustrating the comparative performance of a tunnel field effect transistor according to embodiments of the inventive concepts as compared to a conventional MOSFET when $V_{DD}$ is appropriately scaled.

Figure 11A:
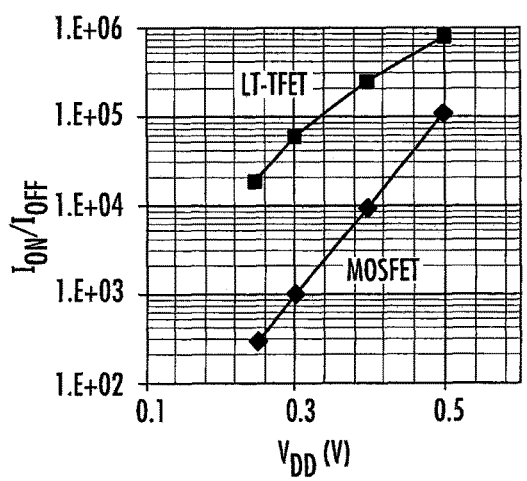
FIGS. 11A-11D are graphs illustrating the comparative simulated performance of a tunnel field effect transistor according to embodiments of the inventive concepts as compared to a conventional metal-oxide-semiconductor field effect transistor.
Figure 11B:
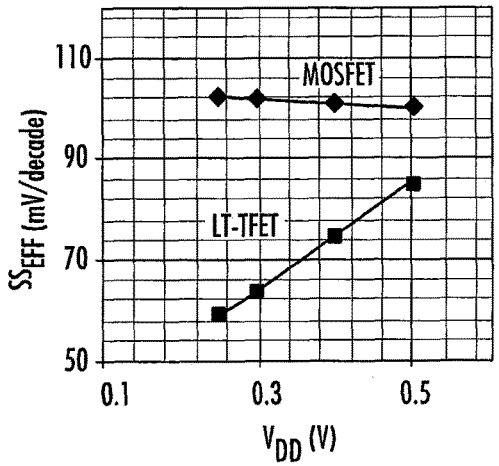

In particular, FIG. 11A illustrates the simulated $I_{ON}/I_{OFF}$ performance of the tunnel field effect transistor 300 as compared to a conventional MOSFET. As shown in the graph, the tunnel field effect transistor 300 exhibits superior $I_{ON}/I_{OFF}$ performance, particularly at lower power supply voltages. FIG. 11B illustrates the simulated effective sub-threshold swing for a conventional MOSFET as compared to the tunnel field effect transistor 300 at room temperature. The MOSFET has an effective sub-threshold swing of about 100 mV/decade. In contrast, the tunnel field effect transistor 300 shows en effective sub-threshold swing ($S_{EFF}$) values of less than 60 mV/decade at low power supply voltages.

Figure 11C:
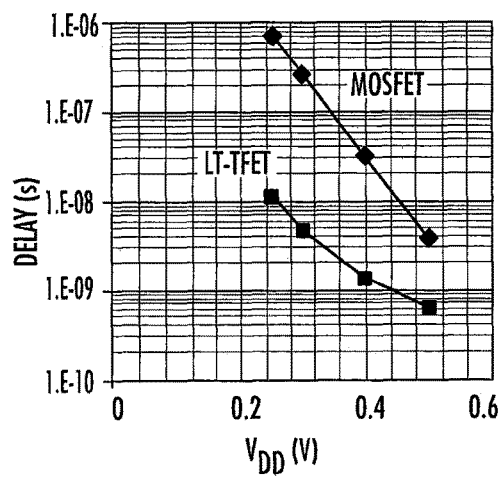
Figure 11D:
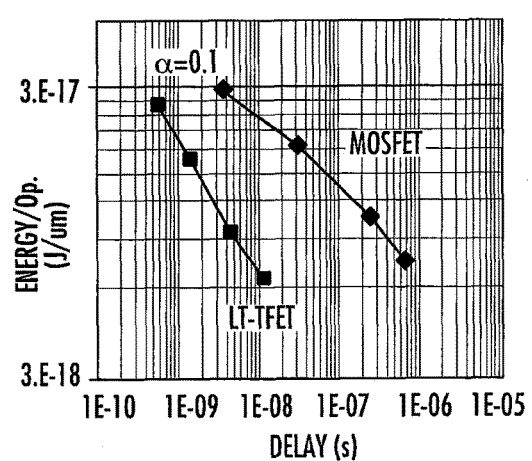

FIG. 11C is a plot of intrinsic delay versus $V_{DD}$, which was determined assuming that the wiring capacitance was 0.5 fF/micron. As shown in the graph, the tunnel field effect transistor 300 exhibits reduced delay values as compared to the conventional MOSFET. Finally, FIG. 11D plots the energy-per-operation versus the intrinsic delay. As shown in FIG. 11D, for a fixed delay value, the tunnel field effect transistor 300 requires less energy per operation as compared to the conventional MOSFET. Thus, FIGS. 11A-11D show that because of the improved sub-threshold swing, the tunnel field effect transistors according to embodiments of the inventive concepts may provide significant enhancement in energy consumption and delay performance. FIGS. 11A-11D also show that the improvement in performance is more pronounced at low values of $V_{DD}$.

Figure 12:
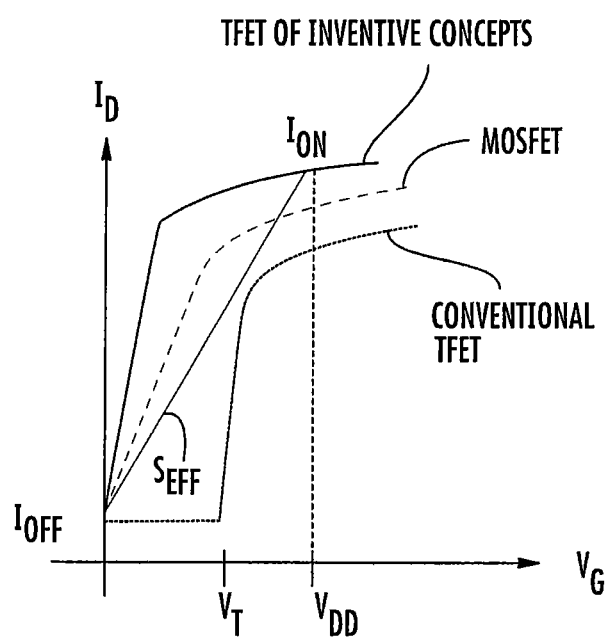
FIG. 12 is a schematic graph that illustrates the improved performance that may be provided by the tunnel field effect transistors according to embodiments of the inventive concepts as compared to conventional transistors.

FIG. 12 is a schematic graph that illustrates the current-voltage characteristics of a tunnel field effect transistor according to embodiments of the inventive concepts as compared to a conventional MOSFET and a conventional tunnel field effect transistor such as the tunnel field effect transistor of FIG. 1 or FIG. 2. The curves in FIG. 12 for the conventional MOSFET and a conventional tunnel field effect transistor are the same as shown in FIG. 3 above.

As shown in FIG. 12, tunnel field effect transistors according to embodiments of the inventive concepts may have lower turn-on voltages $V_T$. When combined with the steeper sub-threshold slope that is possible with the use of tunnel field effect transistors, it can be seen that these devices provide improved current-voltage characteristics as compared to conventional MOSFET and tunnel field effect transistors, and may perform well at very low power supply voltages. As shown in FIG. 12, the following relationship exists for the effective sub-threshold swing ($S_{EFF}$) of tunnel field effect transistors according to embodiments of the inventive concepts, conventional MOSFETs, and conventional tunnel field effect transistors:

$$S_{EFF, \text{ INVENTIVE CONCEPTS}} > S_{EFF, \text{ MOSFET}} > S_{EFF, \text{ CONVENTIONAL TFET}} \quad (5)$$

FIGS. 13A-13H are cross-sectional diagrams that schematically illustrate a method of forming the tunnel field effect transistor 300 according to certain embodiments of the inventive concepts.

Figure 13A:
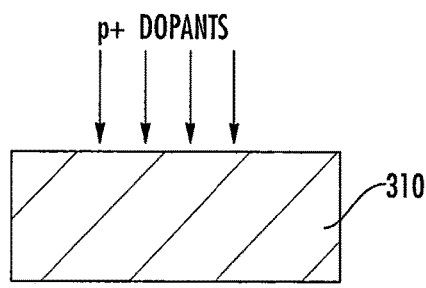
FIGS. 13A-13I are cross-sectional diagrams that schematically illustrate a method of forming a tunnel field effect transistor according to certain embodiments of the inventive concepts.
Figure 13B:
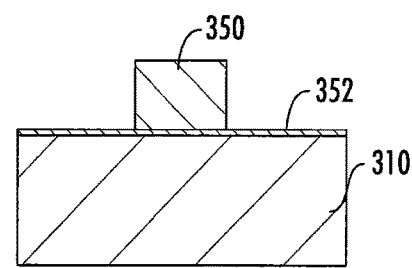

As shown in FIG. 13A, a silicon substrate 310 may doped with p-type dopants via, for example, ion implantation. In some embodiments, the p-type dopants may be implanted across the entire surface of the substrate 310. In some embodiments, the substrate 310 may be implanted to have p-type dopant concentrations of between about $1 \times 10^{16}/cm^3$ to about $1 \times 10^{18}/cm^3$.

Referring to FIG. 1313, a gate insulating layer 352 may be formed over the entire surface of the substrate 310. In some embodiments, the gate insulating layer 352 may be a silicon-oxynitride layer having a thickness of between about 0.5 nanometers to about 3 nanometers. It will be appreciated, however, that a wide variety of dielectric materials may be used, and that the thickness of the gate insulating layer 352 may vary based on the type of material used and/or the desired application. A polysilicon gate electrode 350 may then be deposited and patterned from the gate insulating layer 352 using conventional techniques. As discussed above, the polysilicon gate electrode 350 may be formed as a strained polysilicon gate electrode 350.

Figure 13C:
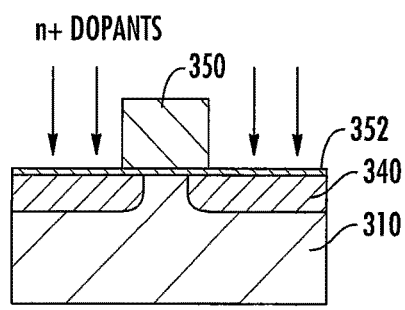

Referring to FIG. 13C, n-type dopants may be implanted into the exposed upper surface of the substrate 310 via ion implantation. The implantation of the n-type dopants may form the drain region 340 and may dope the portion of the substrate 310 that is formed into the heavily-doped n-type region 326 of the source region 320 in a later processing step. In some embodiments, the implantation step may include implanting n-type dopants at an angle into the upper surface of the substrate 310 to facilitate forming the heavily-doped n-type region 326 of the source region 320 underneath the gate electrode 350. An activation anneal may be carried out to activate the implanted dopants.

Figure 13D:
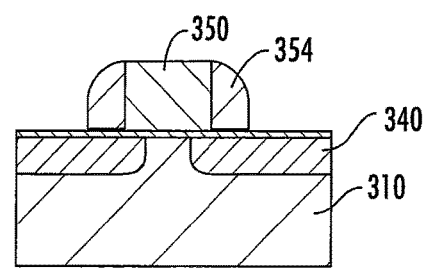
Figure 13E:
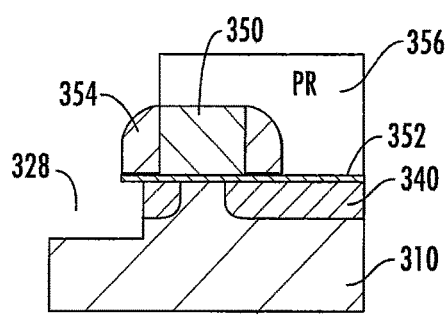

Referring to FIG. 13D, silicon nitride spacers 354 may be formed on sidewalls of the polysilicon gate electrode 350 using conventional CMOS spacer formation techniques. Then, as shown in FIG. 13E, photolithography may be used to form a mask 356 over the gate electrode 350 and the drain region 340, and then an etching process may be performed to remove the gate insulating layer 352 and the upper portion of the substrate 310 in the area where the p-type portion of the source region of the transistor is to be formed to create a recess 328. In some embodiments, the silicon nitride spacers 354 may be formed after the etching process of FIG. 13E is performed instead of before the etching process.

Figure 13F:
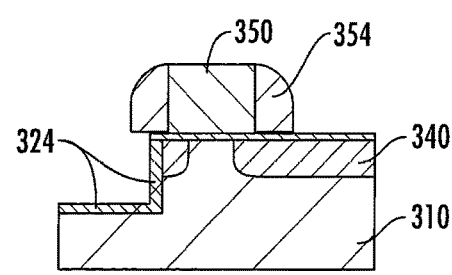
Figure 13G:
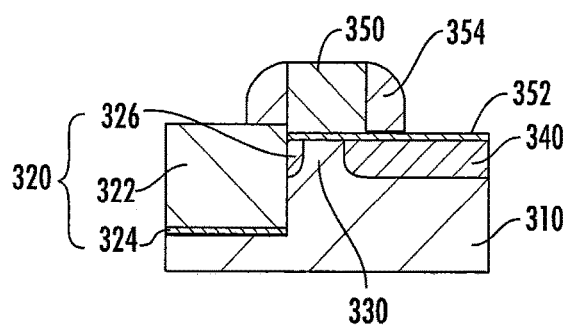
Figure 13H:
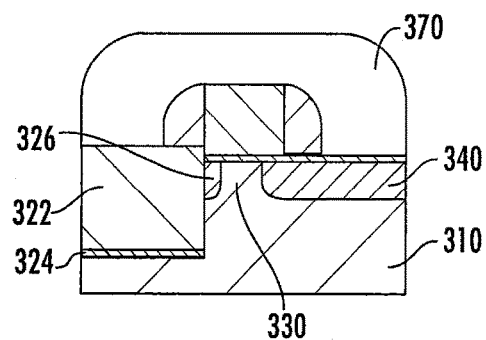
Figure 13I:
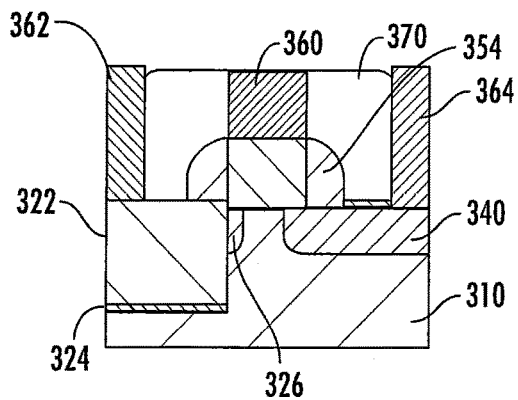

Referring to FIG. 13F, an undoped silicon-germanium layer 324 is epitaxially grown from the top and side surfaces of the recess 328. Then, referring to FIG. 13G, a p-type silicon-germanium region 322 is epitaxially grown from the top and side surfaces of the undoped (i-type) silicon-germanium region 324. Next, referring to FIG. 13H, a stressed contact liner 370 may be formed on the entire surface of the device. Then referring to FIG. 13I, the contact liner 370 may be patterned using standard CMOS photolithography and etching techniques and metal gate, source and drain contacts 360, 362, 364 may be formed on the gate electrode 350, the source region 320 and the drain region 340, respectively.

Figure 14:
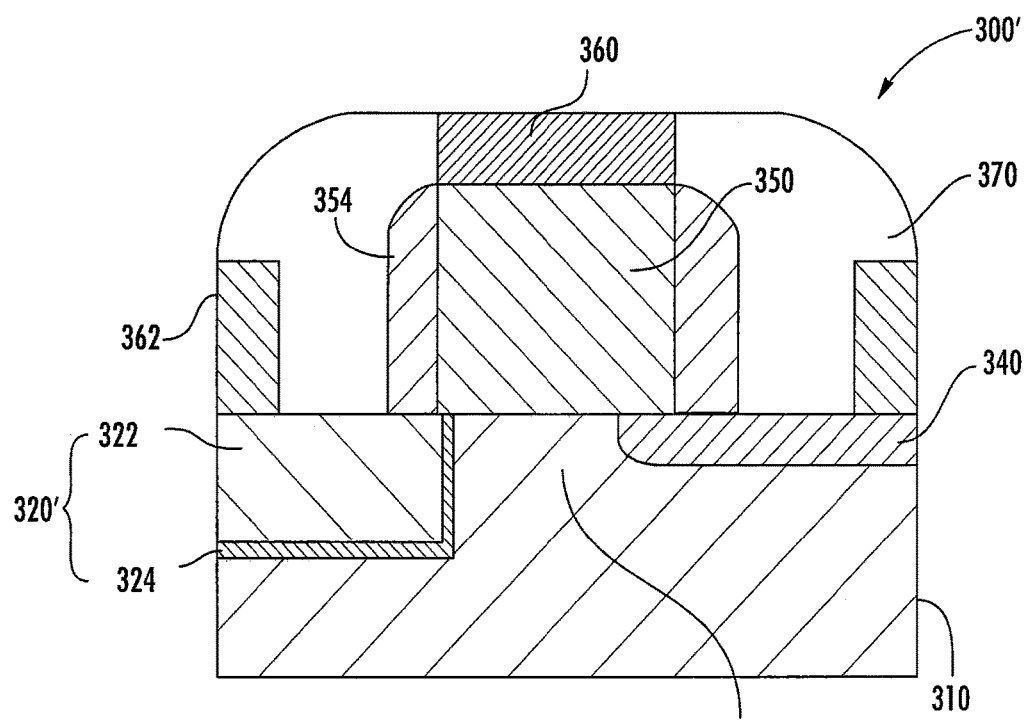
FIG. 14 is a cross-sectional diagram of a tunnel field effect transistor according to further embodiments of the inventive concepts.

FIG. 14 is a cross-sectional diagram of a tunnel field effect transistor 400 according to further embodiments of the inventive concepts.

As shown in FIG. 14, the tunnel field effect transistor 300' is similar to the tunnel field effect transistor 300 of FIG. 4, except that the shallow n-type extension 326 is omitted in the tunnel field effect transistor 300'. While the tunnel field effect transistor 300' that is illustrated in FIG. 14 includes a stressed gate electrode 350 and a stressed contact liner 370, it will be appreciated that in still other embodiments the gate electrode 35Q may not be a stressed pattern and/or the stressed contact liner 370 may be omitted or replaced with a non-stressed layer.

Figure 15:
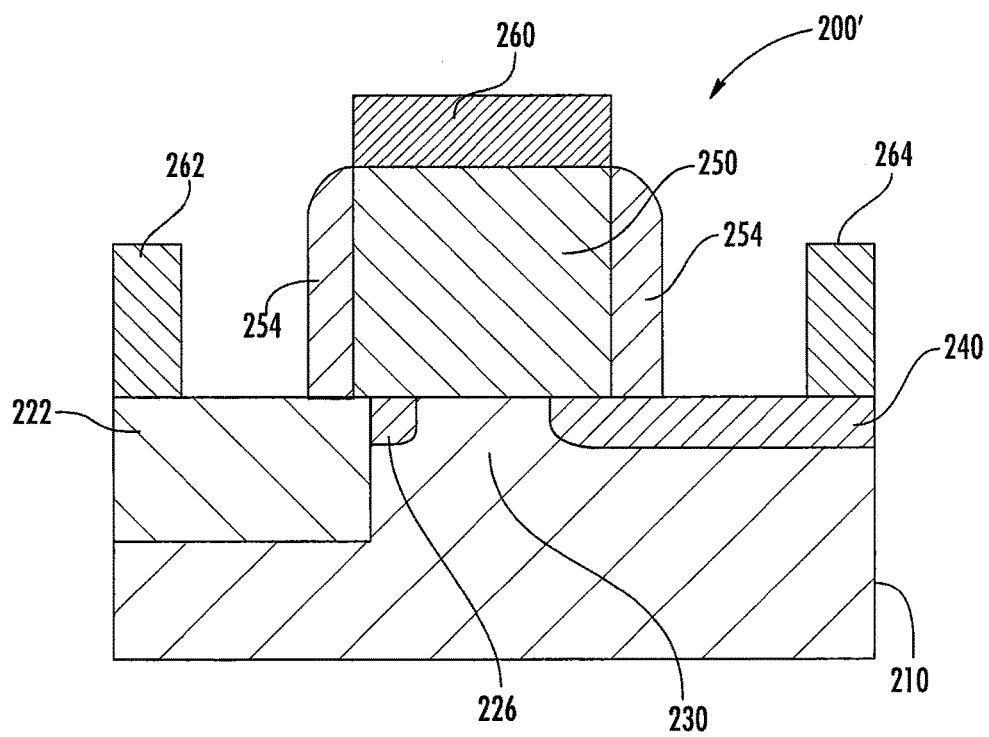
FIG. 15 is a cross-sectional diagram of a tunnel field effect transistor according to still further embodiments of the inventive concepts.

FIG. 15 is a cross-sectional diagram of a tunnel field effect transistor 200' according to still further embodiments of the inventive concepts.

As shown in FIG. 15, the tunnel field effect transistor 200' is similar to the tunnel field effect transistor 200 of FIG. 2, except that the gate electrode 250' in the tunnel field effect transistor 200' is a strained gate electrode, and the tunnel field effect transistor 200' includes a stressed contact liner 270. The gate electrode 250' and stressed contact liner 270 may impart longitudinal tensile stress on the source regions 220 and the channel region 230 of the device. As discussed above with reference to FIG. 7, the <110> longitudinal tensile stress that is applied to the source region and the channel region may reduce the bandgap of the silicon-germanium or germanium portion of the source region without significantly impacting the bandgap in the channel region. This may reduce the turn-on voltage of the device without significantly impacting the OFF-state performance of the device.

Pursuant to embodiments of the inventive concepts, tunnel field effect transistors are provided that may be manufactured on bulk silicon substrates that are fully compatible with conventional CMOS fabrications processes. The tunnel field effect transistors according to embodiments of the inventive concepts may exhibit very low turn-on voltages steeper sub-threshold swings as compared to both MOS-FETs and conventional tunnel field effect transistors, and hence may operate as ultra low-power devices.

Embodiments of the inventive concepts have been described above with reference to the accompanying drawings, in which example embodiments are shown. The inventive concepts may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout the drawings and specification. As used herein the expression "and/or" includes any and all combinations of one or more of the associated listed items.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention.

It will be understood that when an element is referred to as being "coupled to" or "connected to" or "on" another element, it can be directly coupled to, connected to or on the other element or intervening elements may also be present. In contrast, when an element is referred to as being "directly coupled to" or "directly connected to" or "directly on" another element, there are no intervening elements present. Other words used to describe the relationship between elements should be interpreted in a like fashion (i.e., "between" versus "directly between", "adjacent" versus "directly adjacent", etc.).

Relative terms such as "below" or "above" or "upper" or "lower" or "horizontal" or "vertical" may be used herein to describe a relationship of one element, layer or region to another element, layer or region as illustrated in the figures. It will be understood that these terms are intended to encompass different orientations of the device in addition to the orientation depicted in the figures.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises", "comprising", "includes" and/or "including" when used in this specification, specify the presence of stated features, elements, and/or components, but do not preclude the presence or addition of one or more other features, elements, components, and/or groups thereof.

Embodiments of the inventive concepts have been described above with reference to cross-section illustrations that are schematic illustrations of idealized embodiments (and intermediate structures) of the inventive concepts. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

All embodiments can be combined in any way and/or combination.

In the drawings and specification, there have been disclosed typical embodiments of the inventive concepts and, although specific terms are employed, they are used in a generic and descriptive sense only and not for purposes of limitation, the scope of the inventive concepts being set forth in the following claims.

What is claimed is:

1. A tunnel field effect transistor, comprising:
   a semiconductor substrate;
   a source region of the tunnel field effect transistor in the semiconductor substrate;
   a drain region of the tunnel field effect transistor in the semiconductor substrate;
   a channel region of the tunnel field effect transistor in the semiconductor substrate between the source region and the drain region;
   a gate electrode of the tunnel field effect transistor on the semiconductor substrate above the channel region, wherein a gate insulating layer is between the gate electrode and the channel region;
   wherein the source region comprises a first region having a first conductivity type, a third region having a second conductivity type that is different from the first conductivity type, and a second region having an intrinsic conductivity type that is between the first region and the third region,
   wherein the first region of the source region forms a first homojunction with the second region of the source region, wherein the third region of the source region forms a second homojunction with the channel region, and wherein the second region of the source region forms a heterojunction with the third region of the source region,
   wherein the second region of the source region extends along a vertical sidewall of the first region and is in direct contact with the gate insulating layer, and
   wherein the third source region is in direct contact with the gate insulating layer.

2. The tunnel field effect transistor of claim 1, wherein the channel region has the first conductivity type, and the drain region has the second conductivity type, and wherein the third region of the source region is between the second region of the source region and the channel region.

3. The tunnel field effect transistor of claim 2, wherein the first conductivity type is p-type conductivity and the second conductivity type is n-type conductivity.

4. The tunnel field effect transistor of claim 1, wherein the semiconductor substrate is a silicon substrate, and wherein the first region of the source region includes germanium, and the third region of the source region and the channel region does not include germanium.

5. The tunnel field effect transistor of claim 4, wherein the second region of the source region includes germanium.

6. The tunnel field effect transistor of claim 1, wherein the second region of the source region directly abuts the first region of the source region and extends further into the semiconductor substrate from a top surface of the semiconductor substrate than does the first region of the source region.

7. The tunnel field effect transistor of claim 1, wherein the gate electrode comprises a stressed polysilicon gate electrode that is configured to impart a longitudinal stress on at least a portion of the source region.

8. The tunnel field effect transistor of claim 1, further comprising a stressed silicon nitride layer on the source region between the gate electrode and a source contact.

9. The tunnel field effect transistor of claim 1, wherein the second region of the source region extends underneath the first region of the source region.

10. The tunnel field effect transistor of claim 1, wherein the second region extends along a vertical sidewall of the first region.

11. The tunnel field effect transistor of claim 1, wherein the first region of the source region extends farther below a top surface of the semiconductor surface than the third region.

12. A tunnel field effect transistor, comprising:
    a semiconductor substrate;
    a source region of the tunnel field effect transistor in the semiconductor substrate, the source region including a first region that is doped with first conductivity type dopants, a second undoped region, and a third region that is doped with second conductivity type dopants;
    a drain region of the tunnel field effect transistor that is doped with the second conductivity type dopants in the semiconductor substrate, the second conductivity type being opposite the first conductivity type;
    a channel region of the tunnel field effect transistor in the semiconductor substrate between the source region and the drain region, the channel region having the first conductivity type;
    a gate electrode of the tunnel field effect transistor on the semiconductor substrate above the channel region;
    a gate insulating layer between the gate electrode and the first region, the second region, and the third region of the source region;
    a stressed silicon nitride layer on the source region between the gate electrode and a source contact that is in direct contact the gate insulating layer, wherein the stressed silicon nitride layer is in direct contact with a portion of the gate insulating layer that is between the gate electrode and the source region,
    wherein the second undoped region is between the first region of the source region and the channel region, and
    wherein the second undoped region is between the first region and the third region such that the first region is spaced apart from the third region.

13. The tunnel field effect transistor of claim 12, wherein the first region of the source region is a $Si_{1-x}Ge_{x,\ x>0}$ region and the channel region is a silicon region.

14. The tunnel field effect transistor of claim 12, wherein the first region of the source region and the second undoped region of the source region are $Si_{1-x}Ge_{x,\ x>0}$ regions, wherein the third region of the source region and the channel region are silicon regions, and wherein the first conductivity type dopants are p-type conductivity dopants and the second conductivity type dopants are n-type conductivity dopants.

15. The tunnel field effect transistor of claim 12, wherein a depth of the first region of the source region from a top surface of the semiconductor substrate exceeds a depth of the third region of the source region from the top surface of the semiconductor substrate.

16. The tunnel field effect transistor of claim 12, wherein the gate electrode comprises a stressed polysilicon gate electrode that is configured to impart a longitudinal strain on at least a portion of the source region.

17. The tunnel field effect transistor of claim 12, further comprising:
a gate spacer between the gate electrode and the stressed silicon nitride layer, wherein the gate spacer is in direct contact with the gate insulating layer and with the stressed silicon nitride layer.

18. A tunnel field effect transistor, comprising:
a semiconductor substrate;
an Si channel region in the semiconductor substrate;
a source region adjacent a first side of the Si channel region that includes a first $Si_{1-x}Ge_{x,\ x>0}$ region having a first conductivity type and a second $Si_{1-x}Ge_{x,\ x>0}$ region having an intrinsic conductivity type that is between the first $Si_{1-x}Ge_{x,\ x>0}$ region and the Si channel region;
a drain region adjacent a second side of the Si channel region that is opposite the first side; and
a gate electrode on the semiconductor substrate above a central section of the Si channel region,
wherein the source region further comprises a third Si region having a second conductivity type that is different from the first conductivity type,
wherein the second $Si_{1-x}Ge_{x,\ x>0}$ region is between the first $Si_{1-x}Ge_{x,\ x>0}$ region and the third Si region, and
wherein the first $Si_{1-x}Ge_{x,\ x>0}$ region the second $Si_{1-x}Ge_{x,\ x>0}$ region and the third Si region are in direct contact with a gate insulating layer that is between the gate electrode and the source region.

19. The tunnel field effect transistor of claim 18, wherein the third Si region is between the second $Si_{1-x}Ge_{x,\ x>0}$ region and the Si channel region.

20. The tunnel field effect transistor of claim 19, wherein the Si channel region has the first conductivity type, and wherein the drain region has the second conductivity type.

21. The tunnel field effect transistor of claim 18, wherein the second $Si_{1-x}Ge_{x,\ x>0}$ region is between the first $Si_{1-x}Ge_{x,\ x>0}$ region and the third Si region such that the first $Si_{1-x}Ge_{x,\ x>0}$ region is spaced apart from the third Si region.

* * * * *